(12) United States Patent
Wang et al.

(10) Patent No.: US 10,530,375 B1
(45) Date of Patent: Jan. 7, 2020

(54) HIGH SPEED FREQUENCY DIVIDER

(71) Applicant: Xilinx, Inc., San Jose, CA (US)

(72) Inventors: Yipeng Wang, Singapore (SG); Kee Hian Tan, Singapore (SG); Stanley Y. Chen, Cupertino, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/122,761

(22) Filed: Sep. 5, 2018

(51) Int. Cl.
*H03B 19/12* (2006.01)
*H03L 7/197* (2006.01)
*H03L 7/193* (2006.01)

(52) U.S. Cl.
CPC ............ *H03L 7/1976* (2013.01); *H03L 7/193* (2013.01)

(58) Field of Classification Search
CPC .............................. H03L 7/1976; H03L 7/193
USPC ....................... 377/48, 47; 327/115, 117, 156
See application file for complete search history.

(56) References Cited

U.S. PATENT DOCUMENTS

| | | | |
|---|---|---|---|
| 6,043,692 A | 3/2000 | Linoff | |
| 6,078,209 A | 6/2000 | Linoff | |
| 6,677,879 B1 | 1/2004 | Nix et al. | |
| 6,784,822 B1 | 8/2004 | Nix et al. | |
| 7,012,985 B1 | 3/2006 | Nix | |
| 7,280,628 B1 | 10/2007 | Gupta et al. | |
| 7,535,278 B1 | 5/2009 | Ondris et al. | |
| 8,836,391 B2 | 9/2014 | Upadhyaya et al. | |
| 9,385,769 B2 | 7/2016 | Elzeftawi | |
| 9,608,644 B1 | 3/2017 | Raj et al. | |
| 9,742,380 B1 | 8/2017 | Raj et al. | |
| 2007/0174648 A1* | 7/2007 | Panchal | G06F 1/08 713/500 |

OTHER PUBLICATIONS

Moon et al., A Divide-by-16.5 Circuit for 10-Gb Ethernet Transceiver in 0.13-um CMOS, IEEE Journal of Solid-State Circuits, vol. 40, No. 5, pp. 1175-1179, May 2005.
IEEE Standard for Ethernet, in IEEE std 802.3-2015 (Revision of IEEE Std 802.3-2012), pp. 1-4017, Mar. 2006.

* cited by examiner

*Primary Examiner* — Tomi Skibinski
(74) *Attorney, Agent, or Firm* — Paradice and Li LLP; William L. Paradice, III

(57) ABSTRACT

A frequency divider circuit (200) includes a frequency sub-divider (201) to provide a frequency divided clock, a delay circuit (250) configured to delay the frequency divided clock by N+0.5 cycles of the input clock to generate a delayed clock, and an output circuit (202) configured to generate an output clock based on the frequency divided clock and the delayed clock, where the output clock has a frequency that is equal to 1/(N+0.5) times a frequency of the input clock, and N is an integer greater than one.

19 Claims, 7 Drawing Sheets

| State | $Q_0$ | $Q_1$ | $Q_2$ | $Q_3$ | CNT | RST |
|---|---|---|---|---|---|---|
| S1 | 0 | 0 | 0 | 0 | 0 | 0 |
| S2 | 1 | 0 | 0 | 0 | 0 | 0 |
| S3 | 1 | 1 | 1 | 0 | 0 | 0 |
| S4 | 0 | 1 | 1 | 0 | 0 | 0 |
| S5 | 0 | 0 | 1 | 0 | 0 | 0 |
| S6 | 1 | 1 | 1 | 1 | 0 | 0 |
| S7 | 1 | 1 | 1 | 1 | 0 | 0 |
| S8 | 0 | 0 | 1 | 1 | 0 | 0 |
| S9 | 0 | 0 | 1 | 1 | 1 | 0 |
| S10 | 1 | 1 | 0→0 | 0→0 | 0 | 0 |
| S11 | 1→0 | 1→0 | 0→0 | 0→0 | 1→0 | 1 |

HIGH SPEED FREQUENCY DIVIDER

TECHNICAL FIELD

Aspects of the present disclosure relate generally to frequency dividers, and specifically to high speed fractional frequency dividers.

BACKGROUND

Frequency dividers may be used to generate lower-frequency signals from higher-frequency signals. Some frequency dividers may generate an output clock having a frequency that is equal to 1/N times the frequency of an input clock, where N is an integer greater than 1. Some frequency dividers may propagate an input signal through a series of flip-flops that are clocked on rising edges of a clock signal, for example, so that each of the flip-flops generates an output signal that is an incrementally delayed version of the input signal. Edge transitions of the flip-flop output signals may be used to divide the period of the input clock by the value of N. For example, if the delay between the flip-flop output signals is equal to the period of the input signal, then the rising edge of the output signal generated by the $N^{th}$ flip-flop may be used to generate the divide-by-N output signal.

Other frequency dividers may generate an output signal having a frequency that is 1/(N+0.5) times the frequency of an input signal, where N+0.5 is a non-integer greater than one. These frequency dividers, which may be referred to as fractional frequency dividers, may also propagate an input signal through a series of flip-flops that are clocked by a clock signal, for example, so that each of the flip-flops generates an output signal that is an incrementally delayed version of the input signal. Unlike divide-by-N frequency dividers, fractional frequency dividers typically clock the series of flip-flops using both the rising edges and the falling edges of the input clock, for example, to identify the half-cycle of the input clock. For example, if first edge transitions of a given flip-flop output signal resulting from rising edges of the input clock align with edge transitions of the input signal, then second edge transitions of the given flip-flop output signal resulting from falling edges of the input clock may be aligned with half-periods of the input signal.

If the duty cycle of the input clock is not equal to 50%, then the edge transitions of the flip-flop output signals may not be equally spaced apart, which may degrade accuracy (such as because one or more of the edge transitions may not align with the half-period of the input signal. In addition, if both the rising and falling edges of the input clock are used to generate the incrementally delayed flip-flop output signals, then the critical timing path of the fractional frequency divider may be one half of the period of the input clock (rather than a full period of the input clock), which in turn may reduce processing time of the fractional frequency divider by as much as one-half (as compared to a divide-by-N frequency divider).

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to frequency dividers and methods of their operation. An example frequency divider may include a frequency sub-divider, a delay circuit, and an output circuit. The frequency sub-divider may include an input to receive an input clock and may include an output to provide a frequency divided clock. In some embodiments, the frequency sub-divider may include a first divide-by-4 frequency sub-divider, a second divide-by-4 frequency sub-divider, and a synchronization flip-flop. The first and second divide-by-4 frequency sub-dividers may be cascaded together, and the synchronization flip-flop may generate the frequency divided clock based on an output signal provided by one of the first and second divide-by-4 frequency sub-dividers. The frequency sub-divider may also include a count detector and a reset flip-flop. The count detector may be configured to generate a count signal based on output signals generated by the first and second divide-by-4 frequency sub-dividers. The reset flip-flop may be configured to generate a reset signal based on the count signal.

The delay circuit may receive the frequency divided clock, may include a plurality of single-edge triggered flip-flops connected in series, and may be configured to delay the frequency divided clock by N+0.5 cycles of the input clock to generate a delayed clock. In some embodiments, a last of the single-edge triggered flip-flops may be configured to sample data on first edges of the input clock, and the other single-edge triggered flip-flops may be configured to sample data on second edges of the input clock. In some aspects, the plurality of single-edge triggered flip-flops may be configured to delay the frequency divided clock by 5.5 cycles of the input clock to generate the delayed clock.

The output circuit may include a first input to receive the frequency divided clock, a second input to receive the delayed clock, and an output to provide an output clock having a frequency that is equal to 1/(N+0.5) times a frequency of the input clock, wherein N is an integer greater than one. In some embodiments, the output circuit may be a logic gate configured to perform a logical AND or a logical NAND operation on the frequency divided clock and the delayed clock to generate the output clock. In some aspects, the frequency of the output clock may be 1/5.5 times the frequency of the input clock, and the frequency divided clock may have a frequency that is 1/11 times the frequency of the input clock.

An example method disclosed herein may be used to operate a frequency divider. The method may include frequency-dividing the input clock to generate a frequency divided clock using a number of cascaded divide-by-four frequency sub-dividers, delaying the frequency divided clock by N+0.5 cycles of the input clock to generate a delayed clock using a plurality of single-edge triggered flip-flops, and logically combining the frequency divided clock and the delayed clock to generate the output clock. In some aspects, a last of the single-edge triggered flip-flops may be configured to sample data on a first edge of the input clock, and the other single-edge triggered flip-flops may be configured to sample data on a second edge of the input clock.

BRIEF DESCRIPTION OF THE DRAWINGS

The example embodiments are illustrated by way of example and are not intended to be limited by the figures of the accompanying drawings. Like numbers reference like elements throughout the drawings and specification.

FIG. 4 shows a state machine for the frequency sub-divider of FIG. 3.

DETAILED DESCRIPTION

Aspects of the present disclosure may improve the performance of a fractional frequency divider by reducing the number of components in the critical timing path of the fractional frequency divider, and may reduce power consumption of the fractional frequency divider by using single-edge triggered flip-flops rather than double-edge triggered flip-flops. In addition, the fractional frequency dividers disclosed herein may be implemented without using current-mode logic (CML) latches, thereby obviating the need for CML-to-CMOS converters—which in turn may not only reduce circuit area but may also further reduce power consumption.

In some embodiments, the frequency dividers disclosed herein may be configured to generate an output signal having a frequency that is equal to 1/(N+0.5) times the frequency of an input signal, where N is an integer greater than or equal to one and the value N+0.5 is a non-integer greater than zero. In some aspects, the frequency dividers disclosed herein may operate as divide-by-5.5 frequency dividers that generate an output signal having a frequency ($f_{out}$) that is equal to 1/5.5 times the frequency ($f_{in}$) of the input signal (such that $f_{out}=f_{in}/5.5$). The ability to implement a divide-by-5.5 frequency divider without using double-edge triggered flip-flops may reduce the number of flip-flops present in the critical timing path, which in turn may improve performance by relaxing timing constraints.

In the following description, numerous specific details are set forth such as examples of specific components, circuits, and processes to provide a thorough understanding of the present disclosure. The term "coupled" as used herein means coupled directly to or coupled through one or more intervening components or circuits.

Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
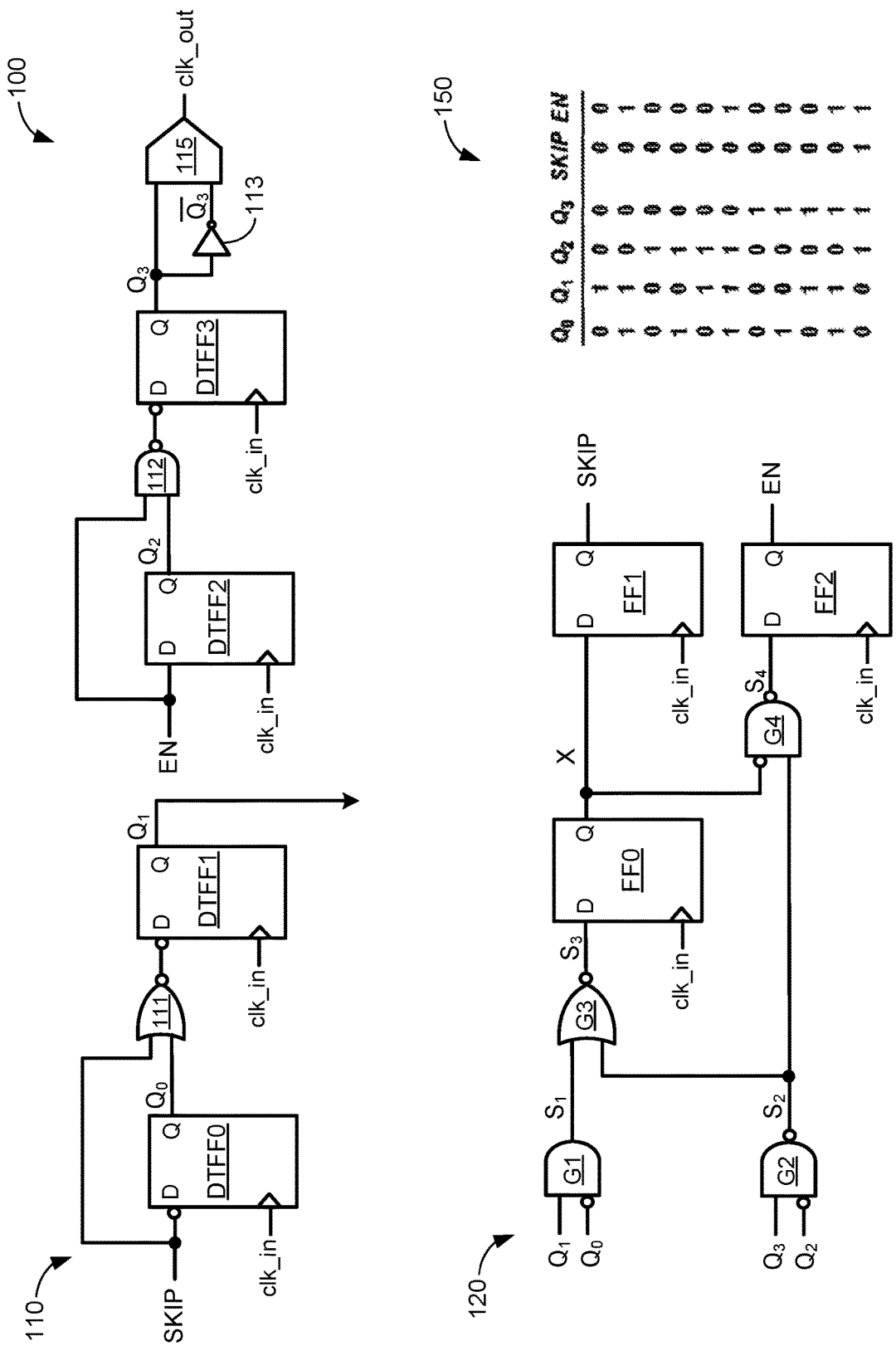
FIG. 1 is a block diagram of a frequency divider.

FIG. 1 shows a frequency divider 100. For purposes of discussion herein, the frequency divider 100 operates as a divide-by-5.5 frequency divider 100, and is implemented using current-mode logic (CML) components. CML is a differential signaling scheme that allows for lower output voltage swings and faster logic transitions than CMOS circuits, and is often used to transmit high-frequency signals (such as 3.125 GHz clocks) across printed circuit boards. CML is also used in many electrical-to-optical interfaces, and is used in the physical layer (PHY) of HDMI video links. Output signals generated by CML circuits may be converted to CMOS signals using a CML-to-CMOS converter.

The frequency divider 100 may include a delay line 110 and a control circuit 120. The delay line 110 includes a number of double-edge triggered flip-flops DTFF0-DTFF3, a number of combinational logic gates 111-112, an inverter 113, and a CML-to-CMOS converter 115. For the example shown in FIG. 1, the logic gate 111 is a NOR gate, and the logic gate 112 is a NAND gate. The CML-to-CMOS converter 115 may be any well-known circuit that converts CML signals to CMOS signals. The flip-flops DTFF0-DTFF3 are connected in series between the control circuit 120 and the converter CML-to-CMOS 115, and may be used to generate an output clock (clk_out) having a frequency that is equal to 1/5.5 times the frequency of an input clock (clk_in). Each of the flip-flops DTFF0-DTFF3 includes a data (D) input to receive an input signal, a clock input (<) to receive the input clock (clk_in), and an output (Q) to generate a corresponding one of the output signals $Q_0$-$Q_3$.

Specifically, the first flip-flop DTFF0 clocks a SKIP signal on edge transitions of the input clock to generate a first flip-flop output signal $Q_0$, which is logically combined with the SKIP signal by the NOR gate 111 to generate a logic signal $D_1$. The second flip-flop DTFF1 clocks the signal $D_1$ on edge transitions of the input clock to generate a second flip-flop output signal $Q_1$, which is provided as an input signal to the control circuit 120. The third flip-flop DTFF2 clocks an enable (EN) signal on edge transitions of the input clock to generate a third flip-flop output signal $Q_2$, which is logically combined with the EN signal by NAND gate 112 to generate a logic signal $D_3$. The fourth flip-flop DTFF3 clocks the signal $D_3$ on edge transitions of the input clock to generate a fourth flip-flop output signal $Q_3$, which is provided to a first input of the converter CML-to-CMOS 115 and also provided as an input signal to the control circuit 120. The fourth flip-flop output signal $Q_3$ is logically inverted by the inverter 113 to generate a complemented output signal $Q_3$_bar, which is provided to a second input of the CML-to-CMOS converter 115. The CML-to-CMOS converter 115 converts the differential signal formed by $Q_3$ and $Q_3$_bar to generate the output signal (clk_out), for example, so that the output signal is compatible with CMOS logic circuits.

The control circuit 120 includes NAND gates G1, G2, and G4, includes a NOR gate G3, and includes three data flip-flops FF0-FF2. The NAND gate G1 logically combines the first and second flip-flop output signals $Q_0$ and $Q_1$ to generate a first signal $S_1$, and the NAND gate G2 logically combines the third and fourth flip-flop output signals $Q_2$ and $Q_3$ to generate a second signal $S_2$. The first and second signals $S_1$ and $S_2$ are logically combined by the NOR gate G3 to generate a third signal $S_3$, which is provided to a data input (D) of flip-flop FF0. The output (Q) of flip-flop FF0 provides an output signal X to a data input (D) of flip-flop FF1, which includes an output (Q) to provide the SKIP signal. The input signals provided to the data inputs of the first and second flip-flops DTFF0 and DTFF1 may be based on the SKIP signal. The NAND gate G4 logically combines the signal X output from the flip-flop FF0 and the second signal $S_2$ to generate a fourth signal $S_4$, which is provided to a data input (D) of flip-flop FF2. The output (Q) of the flip-flop FF2 provides the EN signal. The input signals provided to the data inputs of the third and fourth flip-flops DTFF2 and DTFF3 may be based on the EN signal. The logic states of the flip-flop output signals Q0-Q3, the SKIP signal, and the EN signal are summarized in the truth table 150 shown in FIG. 1.

In some embodiments, the frequency divider 100 may operate as a divide-by-5.5 frequency divider by performing a divide-by-11 frequency division operation and then performing a frequency doubling operation so that the output clock frequency ($f_{clk\_out}$) is 1/5.5 times the input clock frequency ($f_{clk\_in}$). In some aspects, each of the flip-flops DTFF0-DTFF3 may be triggered on both the rising and falling edges of the input clock, for example, to perform frequency doubling. In this manner, the flip-flops DTFF0-DTFF3 may double the frequency of a divide-by-11 signal to generate a divide-by-5.5 signal (such as the output clock shown in FIG. 1).

The frequency divider 100 has a number of drawbacks. By triggering each of the flip-flops DTFF0-DTFF3 on both the rising and falling edges of the input clock, the frequency divider 100 has a critical timing path approximately equal to one-half the period of the input clock. Further, because each of the series-connected flip-flops DTFF0-DTFF is in the critical timing path, logic operations of the frequency divider 100 (such as logic state transitions of the flip-flop output signal $Q_0$-$Q_3$ and logic state transitions of the SKIP and EN signals) may need to be completed in less than one-half the period of the input clock, which may be hereinafter referred to as $0.5T_{clkin}$. In addition, the CML-to-CMOS converter 115 consumes more power and occupies more circuit area than typical output drivers.

In accordance with some aspects of the present disclosure, a frequency divider is disclosed that may increase performance by reducing the number of circuit components within the critical timing path to only 1 component (as compared with the frequency divider 100 of FIG. 1). The frequency dividers disclosed herein may also obviate the need for at least some (if not all) of the combinational logic gates employed by the frequency divider 100 (such as logic gates 111-112 and logic gates G1-G4 of the frequency divider 100 of FIG. 1), thereby reducing signal path delays and allowing for higher operating frequencies. In some embodiments, the frequency dividers disclosed herein may reduce power consumption and circuit area by using single-edge triggered flip-flops (rather than the double-edge triggered flip-flops employed by the frequency divider 100 of FIG. 1). In addition, the relaxed timing requirements of frequency dividers disclosed herein may allow for their implementation using CMOS components (rather than CML components), which in turn may obviate the need for CML-to-CMOS converters (such as the CML-to-CMOS converter 115). Omitting CML-to-CMOS converters may further reduce power consumption and circuit area, for example, as compared with the frequency divider 100 of FIG. 1.

Figure 2:
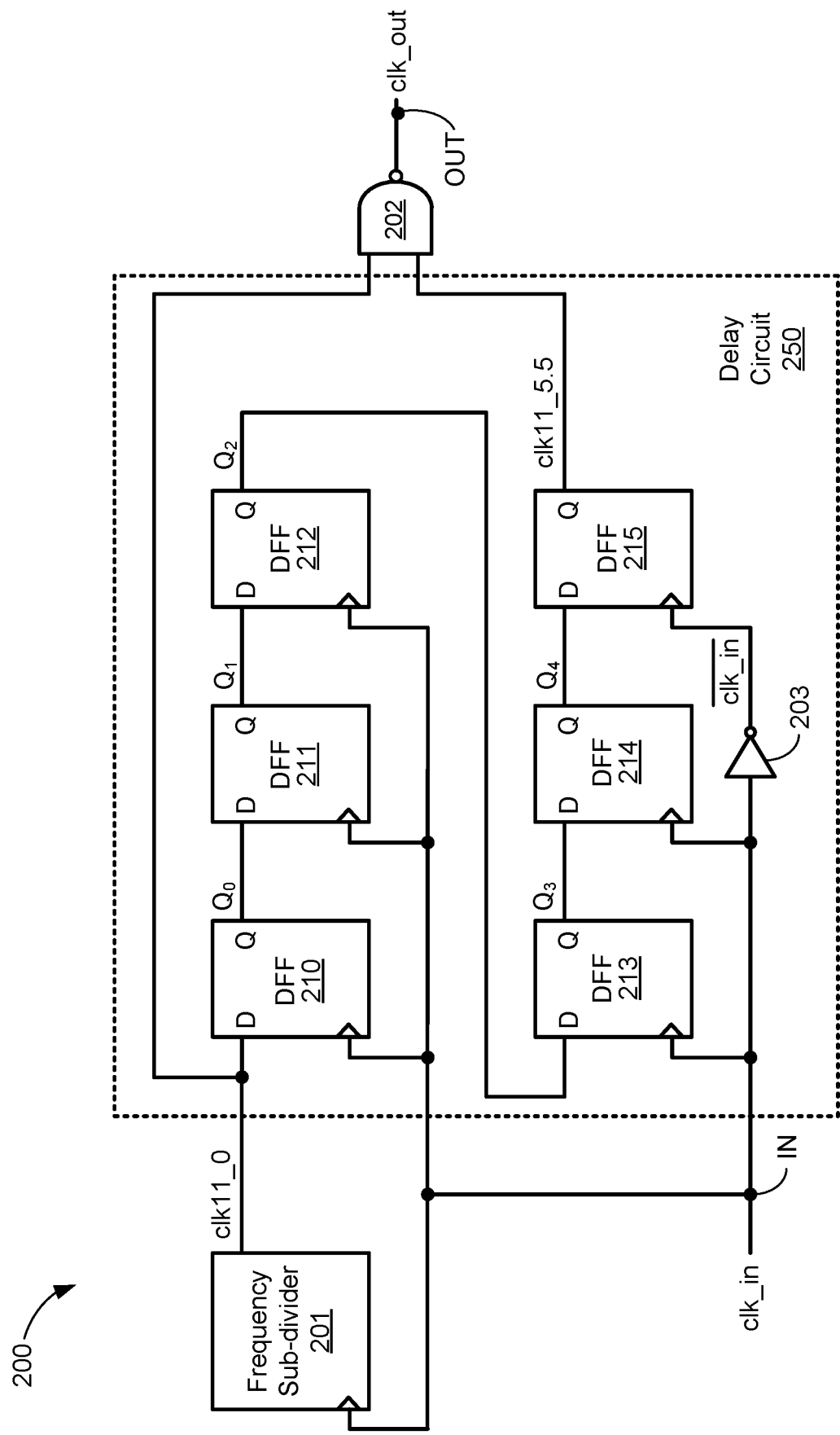
FIG. 2 is a block diagram of a frequency divider, in accordance with some embodiments.

FIG. 2 shows a frequency divider 200 in accordance with some embodiments. The frequency divider 200 includes an input (IN) to receive an input clock (clk_in) having a frequency $f_{in}$, and includes an output (OUT) to provide an output clock (clk_out) having a frequency $f_{out}=f_{in}/N$, where the value of N may be an integer or a fractional number greater than 1. In some embodiments, the value of N=5.5 such that the output clock frequency $f_{out}$ is 1/5.5 times the input clock frequency $f_{in}$ (e.g., $f_{out}=f_{in}/5.5$). In some embodiments, the frequency divider 200 may be used in a 10G Ethernet transceiver to generate a 3.125 GHz clock from a 10.3125 GHz system clock. In some aspects, the 3.125 GHz clock may be used to sample data provided to a four channel 3.125 Gb/s XAUI interface of the 10G Ethernet transceiver, and the 10.3125 GHz system clock may be used to sample data provided to a 10.3125 Gb/s serial interface of the 10G Ethernet transceiver. In other embodiments, the value of N may be any other suitable integer or a fractional number greater than 1.

The frequency divider 200 includes a frequency sub-divider 201, a delay circuit 250 including a plurality of single-edge triggered data flip-flops (DFFs) 210-215, an output circuit 202, and an inverter 203. The frequency sub-divider 201 may be any suitable circuit that can frequency divide an input signal to generate an output signal while maintaining the duty cycle of the output signal at a selected value. In some embodiments, the frequency sub-divider 201 may be a divide-by-11 frequency sub-divider that generates an output signal having a frequency that is one eleventh (1/11) of the input signal frequency, for example, as described for some example implementations herein. In other embodiments, the frequency sub-divider 201 may be a divide-by-M frequency sub-divider, where M may be any suitable integer greater than one.

The output circuit 202 may be any suitable circuit that can logically combine a number of input signals to generate an output signal. In some embodiments, the output circuit 202 may be a NAND gate. In other embodiments, the output circuit 202 may be configured to perform a logical AND operation on its input signals to generate an output signal. The inverter 203 may be any suitable circuit that can logically invert an input signal to generate an output signal that is the logical complement of the input signal. In some embodiments, the inverter 203 may be a CMOS inverter, although other suitable inverter circuits may be used.

Each of the flip-flops 210-215 includes a data input (D) to receive an input signal, an output (Q) to provide an output signal, and a clock input (<) to receive a clock signal. For some embodiments, the flip-flops 210-215 may sample or capture the logic state of input signals in response to either rising edges or falling edges (but not both) of a clock signal provided to their respective clock inputs. Further, although shown in FIG. 2 as including a plurality of single-edge triggered data flip-flops 210-215 connected in series between the frequency sub-divider 201 and the output circuit 202, for other embodiments, the frequency divider 200 may employ other suitable types of flip-flops, latches, or registers (e.g., rather than the data flip-flops 210-215).

The flip-flops 210-215 are connected in series between the frequency sub-divider 201 and a first input of the output circuit 202, for example, such that the output of each of the flip-flops 210-214 is coupled to the data input of a next one of the flip-flops 211-215, respectively. The input clock is provided to the clock inputs of the first five flip-flops 210-214, and a complemented input clock $\overline{clk\_in}$ is provided to the clock input of the sixth (e.g., the last) flip-flop 215 by the inverter 203. Each of the first five flip-flops 210-214 samples input data in response to rising edges of the input clock, and the sixth flip-flop 215 samples input data in response to falling edges of the input clock (e.g., which corresponds to rising edges of the complemented input clock). In this manner, the delay circuit (250) formed by the six single-edge triggered flip-flops (210-215) may delay the frequency divided clock by 5.5 cycles of the input clock to generate a delayed clock.

The frequency sub-divider 201 includes an input to receive the input clock, and includes an output coupled to a second input of the output circuit 202 and to the data input of the first flip-flop 210. In some embodiments, the frequency sub-divider 201 may perform a divide-by-11 frequency division operation on the input clock to generate a frequency divided clock (clk11_0) having a frequency equal to $\frac{1}{11}$ times the input clock frequency (such as $f_{clk11\_0} = f_{clk\_in}/11$). In some embodiments, the frequency divided clock clk11_0 may have a duty cycle equal to $\frac{8}{11} = 72.7\%$, for example, so that the frequency divided clock clk11_0 is in a logic high state during the first eight cycles (out of eleven cycles) of the input clock, and is in a logic low state during the last three cycles of the input clock. In other embodiments, the frequency divided clock clk11_0 may have another suitable duty cycle.

The frequency divided clock clk11_0 is sequentially delayed by the series-connected flip-flops 210-215 to generate a delayed clock (clk11_5.5). In some embodiments, the first flip-flop 210 samples the frequency divided clock clk11_0 on the rising edge of the input clock to generate a first output signal $Q_0$. The second flip-flop 211 samples the first output signal $Q_0$ on the rising edge of the input clock to generate a second output signal $Q_1$, which in turn is sampled by the third flip-flop 212 on the rising edge of the input clock to generate a third output signal $Q_2$, which in turn is sampled by the fourth flip-flop 213 on the rising edge of the input clock to generate a fourth output signal $Q_3$, which in turn is sampled by the fifth flip-flop 214 on the rising edge of the input clock to generate a fifth output signal $Q_4$. The sixth flip-flop 215 samples the fifth output signal $Q_4$ on the rising edge of the logically complemented input clock (which corresponds to the falling edge of the input clock) to generate the delayed clock clk11_5.5.

In some embodiments, each of the first five flip-flops 210-214 may sequentially delay the frequency divided clock clk11_0 by a full cycle of the input clock when generating respective output signals $Q_0$-$Q_4$, and the sixth flip-flop 215 may delay the frequency divided clock clk11_0 by a half-cycle of the input clock when generating the delayed clock clk11_5.5 (e.g., because the sixth flip-flop 215 is clocked on the falling edges of the input clock rather than on the rising edges of the input clock). In this manner, the frequency divided clock clk11_0 may be delayed by 5.5 cycles of the input clock to generate the delayed clock clk11_5.5.

Figure 5:
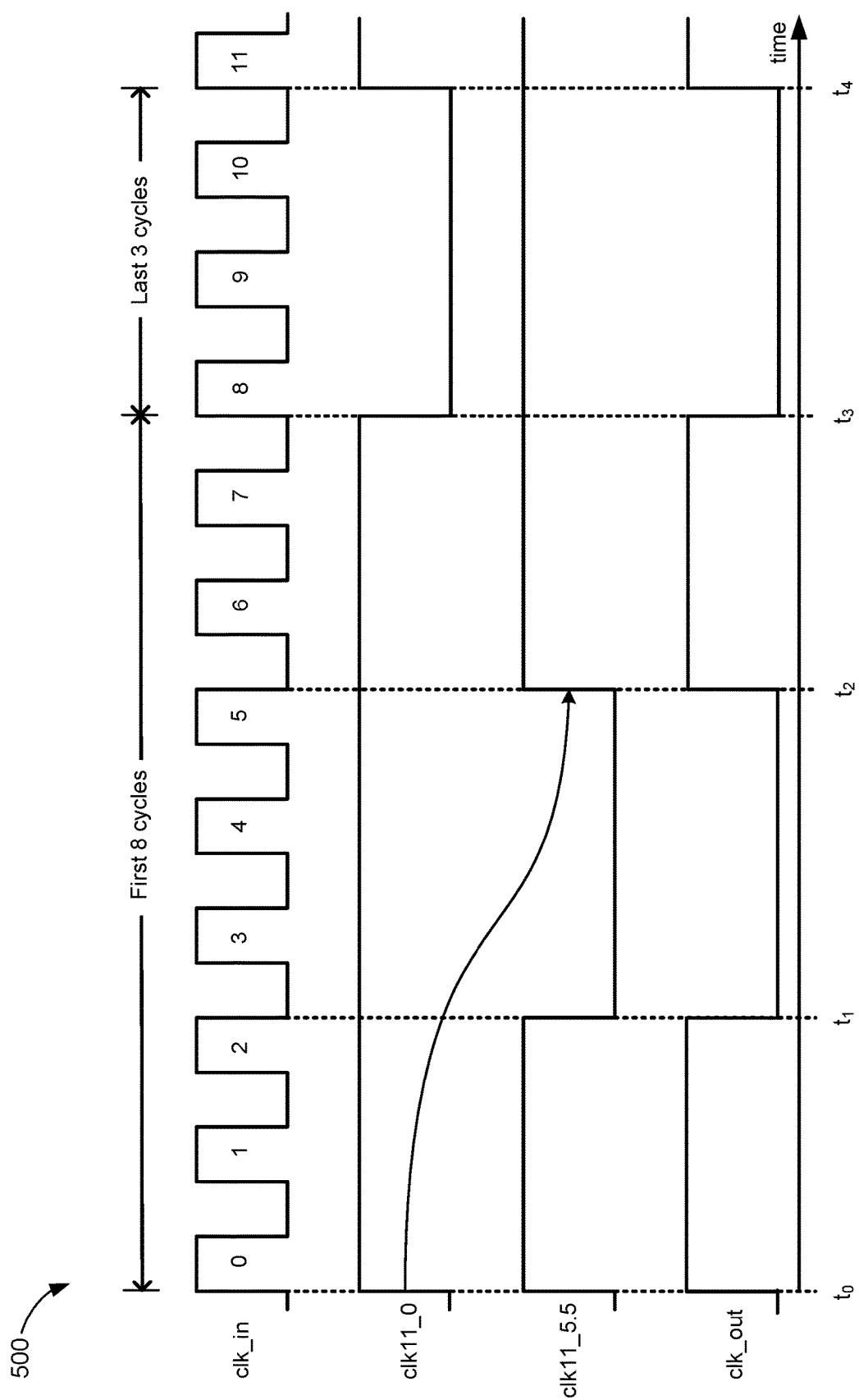
FIG. 5 is an example timing diagram for signals generated by the frequency divider of FIG. 2, in accordance with some embodiments.

The output circuit 202 may perform a logical AND or NAND operation on the frequency divided clock clk11_0 and the delayed clock clk11_5.5 to generate the output clock clk_out. In some embodiments, if either the frequency divided clock clk11_0 or the delayed clock clk11_5.5 is in a logic low state, the output circuit 202 drives the output clock to a logic high state; if both the frequency divided clock clk11_0 and the delayed clock clk11_5.5 are in a logic high state (at the same time), the output circuit 202 drives the output clock to a logic low state. Example waveforms and timing relationships between the input clock clk_in, the frequency divided clock clk11_0, the delayed clock clk11_5.5, and the output clock clk_out are depicted in FIG. 5.

Although other embodiments may use an XOR gate as the output circuit 202 to generate the output clock, a NAND gate may be advantageous (as compared with the XOR gate) because NAND gates exhibit symmetrical capacitive loading on their input terminals, which may minimize (or even eliminate) systematical phase offsets between the frequency divided clock clk11_0 and the delayed clock clk11_5.5.

Figure 3:
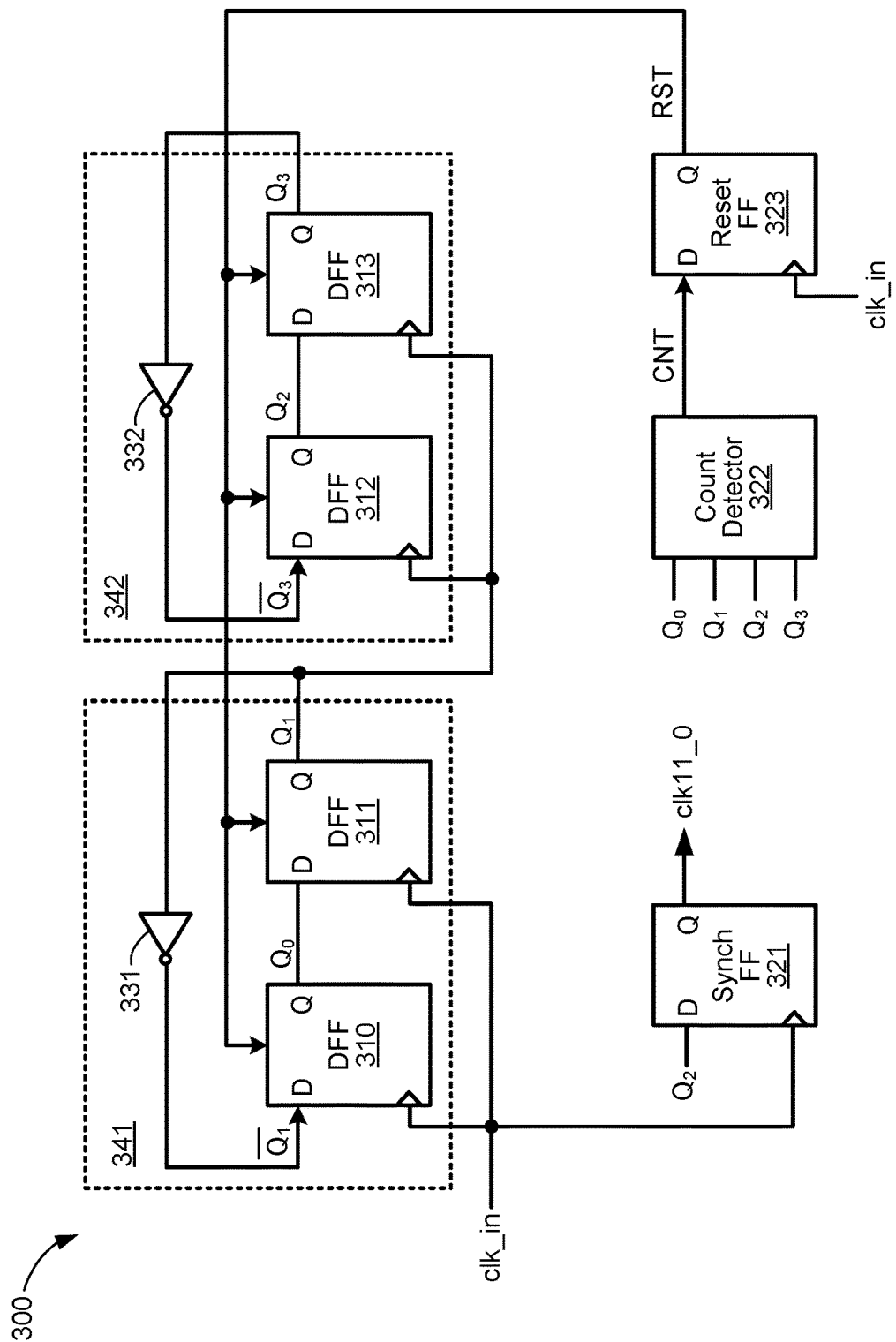
FIG. 3 is a block diagram of a frequency sub-divider, in accordance with some embodiments.

FIG. 3 shows a frequency sub-divider 300 that may be one embodiment of the frequency sub-divider 201 of FIG. 2. The frequency sub-divider 300 includes a number of data flip-flops (DFFs) 310-313, a synchronization flip-flop 321, a count detector 322, a reset flip-flop 323, and a number of inverters 331-332. The first DFF 310 includes a data input (D) coupled to an output of the first inverter 331, includes an output (Q) coupled to the data input of the second DFF 311, and includes a clock input to receive the input clock. The second DFF 312 receives the output signal $Q_0$ of the first DFF 310, includes an output coupled to the data input of the third DFF 312, and includes a clock input to receive the input clock. The third DFF 312 includes a data input coupled to an output of the second inverter 332, includes an output coupled to the data input of the fourth DFF 313, and includes a clock input to receive the input clock. The fourth DFF 313 receives the output signal $Q_2$ of the third DFF 312, includes an output coupled to the input of the second inverter 332, and includes a clock input to receive the input clock. In some aspects, each of the DFFs 310-313 includes a reset terminal to receive a reset signal RST provided by the reset flip-flop 323.

In some embodiments, the first and second DFFs 310-311 and the first inverter 331 may operate together as a first divide-by-4 frequency divider 341, and the third and fourth DFFs 312-313 and the second inverter 332 may operate together as a second divide-by-4 frequency divider 342. In some aspects, the first and second divide-by-4 frequency dividers 341 and 342 may be cascaded together, for example, as depicted in FIG. 3. In addition, or in the alternative, the first and second divide-by-4 frequency dividers 341 and 342 may be synchronous with each other.

The first invertor 331 logically inverts the output signal $Q_1$ of the second DFF 311 to generate a complemented output signal $\overline{Q_1}$, which is provided to the data input of the first DFF 310. The second invertor 332 logically inverts the output signal $Q_3$ of the fourth DFF 313 to generate a complemented output signal $\overline{Q_3}$, which is provided to the data input of the third DFF 312.

The synchronization flip-flop 321 includes a data input to receive the third output signal $Q_2$ from the third DFF 312, includes a clock input to receive the input clock, and includes an output to provide the frequency divided clock clk11_0. In some embodiments, the synchronization flip-flop 321 may be a data flip-flop, as shown in the example of FIG. 3. In other embodiments, the synchronization flip-flop 321 may be any other suitable flip-flop, latch, or register than can transition the frequency divided clock clk11_0 from logic high to logic low in response to a logic high to logic low transition of the third output signal $Q_2$ provided by the third DFF 312 (and that can transition the frequency divided clock clk11_0 from logic low to logic high in response to a logic low to logic high transition of the third output signal $Q_2$).

The count detector 322 includes inputs to receive the output signals $Q_0$-$Q_3$ generated by respective DFFs 310-313, and includes an output to provide a count signal CNT. The count detector 322 may be any suitable circuit that can indicate the current state of the frequency sub-divider 300. In some embodiments, the count detector 322 may indicate the current state of the frequency sub-divider 300 by sequentially counting through the states S1-S11 of the state machine 400 of FIG. 4 based on the logic states of the output signals $Q_0$-$Q_3$ generated by respective DFFs 310-313. In some aspects, the count detector 322 may be configured to maintain the count signal CNT in a logic low state when the frequency sub-divider 300 is in any of states S0-S9, and may be configured to assert the count signal CNT to a logic high state when the frequency sub-divider 300 transitions from state S9 to state S10 of the state machine 400 of FIG. 4.

The reset flip-flop 323 includes a data input to receive the count signal CNT generated by the count detector 322, includes a clock input to receive the input clock, and includes an output to provide a reset signal RST. In some embodiments, the reset flip-flop 323 may be configured to minimize the propagation delay of the first output signal $Q_0$ provided by the first DFF 310, which in turn may allow the frequency sub-divider 300 (and thus the frequency divider 200) to achieve higher operation speeds (e.g., because the output signal $Q_0$ is the only input signal provided to the reset flip-flop 323 that changes logic states when operation of the frequency sub-divider 300 transitions from state S9 to state S10 of the state machine 400 of FIG. 4).

An example operation of the frequency sub-divider 300 is described with respect to the example state machine 400 of FIG. 4. As the rising edges (or the falling edges) of the input clock cause the DFFs 310-313 to drive respective their output signals $Q_0$-$Q_3$ based on sampled input data, the output signals $Q_0$-$Q_3$ may transition between logic states, for example, as depicted by the state machine 400 of FIG. 4. The count detector 322 monitors the logic states of the output signals $Q_0$-$Q_3$, and in response thereto may determine a current state of the state machine 400. For example, when all of the output signals $Q_0$-$Q_3$ are in the logic low state (e.g., logic 0), the count detector 322 may determine that the frequency sub-divider 300 is in state S0; when the output signal $Q_0$ is in the logic high state (e.g., logic 1) and the output signals $Q_1$-$Q_3$ are all in the logic low state, the count detector 322 may determine that the frequency sub-divider 300 is in state S1, and so on. In some aspects, the count detector 322 may be configured to maintain the count signal CNT in a logic low state when the frequency sub-divider 300 is in any of states S0-S9, and may be configured to assert the count signal CNT to a logic high state when the frequency sub-divider 300 transitions from state S9 to state S10. Thus, as illustrated by the state machine 400 of FIG. 4, the count detector 322 may assert the count signal CNT to logic high (e.g., by transitioning the count signal CNT from logic 0 to logic 1) when the output signals $Q_0$ and $Q_2$-$Q_3$ are logic high and the output signal $Q_1$ is logic low.

When operation of the frequency sub-divider 300 transitions from state S10 to state S11, the count detector 322 may transition the count signal CNT from logic high to logic low (e.g., from logic 1 to logic 0). In some embodiments, the frequency sub-divider 300 transitions from state S10 to state S11 when the second output signal $Q_1$ transitions from logic 0 to logic 1 and the third output signal $Q_2$ transitions from logic 1 to logic 0 while each of the first and fourth output signals $Q_0$ and $Q_3$ remain in the logic high state.

The transition of the third output signal $Q_2$ from logic 1 to logic 0 causes the synchronization flip-flop 321 to transition the frequency divided clock clk11_0 from logic 1 to logic 0 (e.g., at time $t_1$ in the example timing diagram 500 of FIG. 5). In this manner, the frequency divided clock clk11_0 may be a re-timed version of the third output signal $Q_2$ provided by the third DFF 312 of the frequency sub-divider 300. Thus, in some embodiments, the duty cycle of the third output signal $Q_2$ is equal to 8/11 (e.g., as indicated by the state machine 400 of FIG. 4), which in turn may cause the output clock clk_out to have a duty cycle equal to 50% (or at least approximately equal to 50%).

The reset flip-flop 323 may generate the reset signal RST based on the logic state (or a particular logic state transition) of the count signal CNT. In some embodiments, the reset flip-flop 323 may be configured to assert the reset signal RST to logic 1 based on a falling edge (e.g., a logic 1 to logic 0 transition) of the count signal CNT. Thus, for example embodiments disclosed herein, the reset flip-flop 323 may transition the reset signal RST from logic 0 to logic 1 when the frequency sub-divider 300 transitions from state S10 to state S11 of the state machine 400. The asserted state of the reset signal RST resets all of the DFFs 310-313, for example, such that the output signals $Q_0$-$Q_3$ of respective DFFs 310-313 are reset to logic low. In this manner, assertion of the reset signal RST to logic 1 may cause the frequency sub-divider 300 to return to state S1 of the state machine 400, which may indicate a new processing cycle of the frequency divider 200 of FIG. 2.

When the frequency sub-divider 300 transitions from state S10 to S11 of the state machine 400, it is important that the third output signal $Q_2$ (provided by the third DFF 312) quickly transitions from logic 1 to logic 0, for example, to ensure that the synchronization flip-flop 321 can transition the frequency divided clock clk11_0 from logic 1 to logic 0 without any unnecessary delays. More specifically, delays in transitioning the third output signal $Q_2$ from logic 1 to logic 0 may cause delays in transitioning the frequency divided clock clk11_0 from logic 1 to logic 0, which in turn may undesirably change the duty cycle of the frequency divided clock clk11_0. Because the duty cycle of the output clock (clk_out) of the frequency divider 200 is determined by the duty cycle of the frequency divided clock clk11_0, an undesirable decrease (or increase) in the duty cycle of clk11_0 may cause a corresponding decrease (or increase) in the duty cycle of clk_out. As such, transitioning the third output signal $Q_2$ from logic 1 to logic 0 in less than one cycle of the input clock may ensure that the duty cycle of the frequency divided clock clk11_0 is maintained at the specified value (such as 8/11).

FIG. 5 shows an example timing diagram 500 of signals generated during operation of the frequency divider 200 of FIG. 2. Prior to time $t_0$, the input clock clk_in, the frequency divided clock clk11_0, the delayed clock clk11_5.5, and the output clock clk_out may be initialized (or reset) to the logic low state. At time $t_0$, the input clock transitions from logic low to logic high, which may cause the frequency divided clock clk11_0, the delayed clock clk11_5.5, and the output clock clk_out to transition from logic low to logic high.

At time $t_1$, the falling edge of the delayed clock clk11_5.5 causes the output circuit 202 to transition the output clock clk_out from logic high to logic low. At time $t_2$, the rising edge of the delayed clock clk11_5.5 causes the output circuit 202 to transition the output clock clk_out from logic low to logic high. At time $t_3$, the rising edge of the input clock clk_in (e.g., corresponding to the eighth cycle of the input clock clk_in) causes the frequency divided clock signal clk11_0 to transition from logic high to logic low, which in turn causes the output circuit 202 to transition the output clock clk_out from logic high to logic low. The frequency divided clock signal clk11_0 remains in the logic low state for three cycles of the input clock clk_in, until time $t_4$. At time $t_4$, the rising edge of the input clock clk_in causes the frequency divided clock clk11_0 to transition from logic low to logic high, which in turn causes the output circuit 202 to transition the output clock clk_out from logic low to logic high.

As described above, when the frequency divided clock clk11_0 has a duty cycle equal to 8/11=72.7%, the frequency divided clock clk11_0 transitions from logic high to logic low on the eighth rising edge of the input clock clk_in (at time $t_3$), and transitions from logic low to logic high on the eleventh rising edge of the input clock clk_in (at time $t_4$). Because the duty cycle of the frequency divided clock clk11_0 may determine the duty cycle of the delayed clock clk11_5.5 and the duty cycle of the output clock clk_out, it is important for the frequency divided clock clk11_0 to have a duty cycle equal to 8/11=72.7%.

The example frequency divider 200 of FIG. 2 may provide several advantages over conventional frequency dividers such as the frequency divider 100 of FIG. 1. For example, because the flip-flops DTFF0-DTFF3 of the frequency divider 100 of FIG. 1 are clocked on both the rising and falling edges of the input clock, logic state transitions of the frequency divider 100 are time constrained by one-half of the input clock cycle. In contrast, by triggering rising edges of the frequency divided clock clk11_0 only on the rising edges of the input clock—rather than on any of the falling edges of the input clock—the frequency divider 200 has an entire clock cycle of the input clock to complete logic operations, which in turn may allow the frequency divider 200 to operate at higher frequencies than the frequency divider 100.

The frequency divider 200 of FIG. 2 also includes less critical timing paths than the frequency divider 100 of FIG. 1. Specifically, the frequency divider 200 may delay the frequency divided clock clk11_0 by 5.5 cycles of the input clock to generate the delayed clock clk11_5.5 by clocking the first five flip-flops 210-214 only on rising edges of the input clock and clocking the sixth flip-flop 215 only on falling edges of the input clock. Because the sixth flip-flop 215 is the only one of the series-connected flip-flops 210-215 that is clocked on falling edges of the input clock, the signal path between the inverter 203 and sixth flip-flop 215 is the only critical timing path corresponding to a half-cycle of the input clock. In contrast, the conventional frequency divider 100 of FIG. 1 includes four critical timing paths—one for each of its flip-flops DTFF0-DTFF3—because each of the flip-flops DTFF0-DTFF3 is triggered on both the rising and falling edges of the input clock. Further, while the combinational logic circuits 111-112 of the frequency divider 100 are positioned within the critical timing paths of the frequency divider 100, the critical timing path of the frequency divider 200 of FIG. 2 does not include any combinational logic circuits.

The relaxed timing constraints of the frequency divider 200 (as compared to the frequency divider 100 of FIG. 1) allows the frequency divider 200 to employ CMOS data flip-flops, rather than CML double-edge triggered latches, to generate delayed clock signals. Thus, unlike the frequency divider 100 of FIG. 1, the frequency divider 200 may not include a CML-to-CMOS converter to translate CML signals to CMOS signals, which in turn may not only reduce circuit area but also may conserve power consumption.

Figure 6:
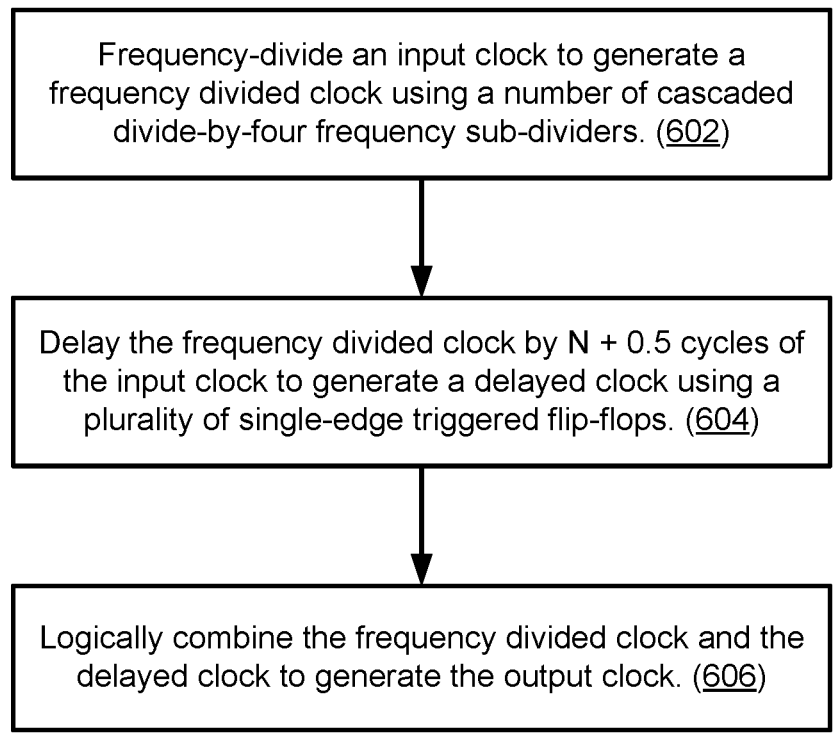
FIG. 6 is an illustrative flow chart depicting an example operation for performing a frequency division operation, in accordance with some embodiments.

FIG. 6 is an illustrative flowchart depicting an example operation 600 for generating a frequency-divided signal, according to the example embodiments. Although described herein with respect to the frequency divider 200 of FIG. 2, the example operation 600 may be performed by any other suitable frequency divider.

The frequency divider 200 may frequency-divide an input clock to generate a frequency divided clock using a number of cascaded divide-by-four frequency sub-dividers (602). In some embodiments, the frequency sub-divider 300 of FIG. 3 may be used to generate the frequency divided clock. In some aspects, the first and second divide-by-four frequency dividers 341 and 342 may sample input data on rising edges of the input clock to generate a number of output signals $Q_0$-$Q_3$, and the synchronization flip-flop 321 may generate the frequency divided clock based on the second output signal $Q_2$. The count detector 322 may determine the current state of the frequency divider 200 based on the output signals $Q_0$-$Q_3$, and may generate a count signal CNT indicative of the current state of the frequency divider 200. The reset flip-flop 323 may generate a reset signal based on the count signal CNT. In some aspects, the count detector 322 may assert the count signal CNT (e.g., to logic high) when the frequency divider 200 has transitioned from state S9 to state S10, and the reset flip-flop 323 may assert the reset signal (e.g., to logic high) when the count signal CNT indicates that the frequency divider 200 has transitioned from state S10 to state S11. The asserted reset signal may reset the outputs of the flip-flops DFF 310-313 of the divide-by-four frequency dividers 341 and 342 to zero.

The frequency divider 200 may delay the frequency divided clock by N+0.5 cycles of the input clock to generate a delayed clock using a plurality of single-edge triggered flip-flops (604). In some embodiments, the frequency divider 200 may use the single-edge triggered flip-flops 210-215 to generate the delayed clock from the frequency divided clock. In some aspects, the single-edge triggered flip-flops 210-215 may delay the frequency divided clock by 5.5 cycles of the input clock to generate the delayed clock. In addition, or in the alternative, the first five single-edge triggered flip-flops 210-214 may sample input data on rising edges of the input clock, and the last single-edge triggered flip-flop 210-215 may sample input data on falling edges of the input clock.

The frequency divider 200 may logically combine the frequency divided clock and the delayed clock to generate the output clock (606). In some embodiments, the output circuit 202 may perform a logical AND or NAND operation on the frequency divided clock and the delayed clock to generate the output clock. In some aspects, the frequency of the output clock may be 1/5.5 times the frequency of the input clock.

Figure 7:
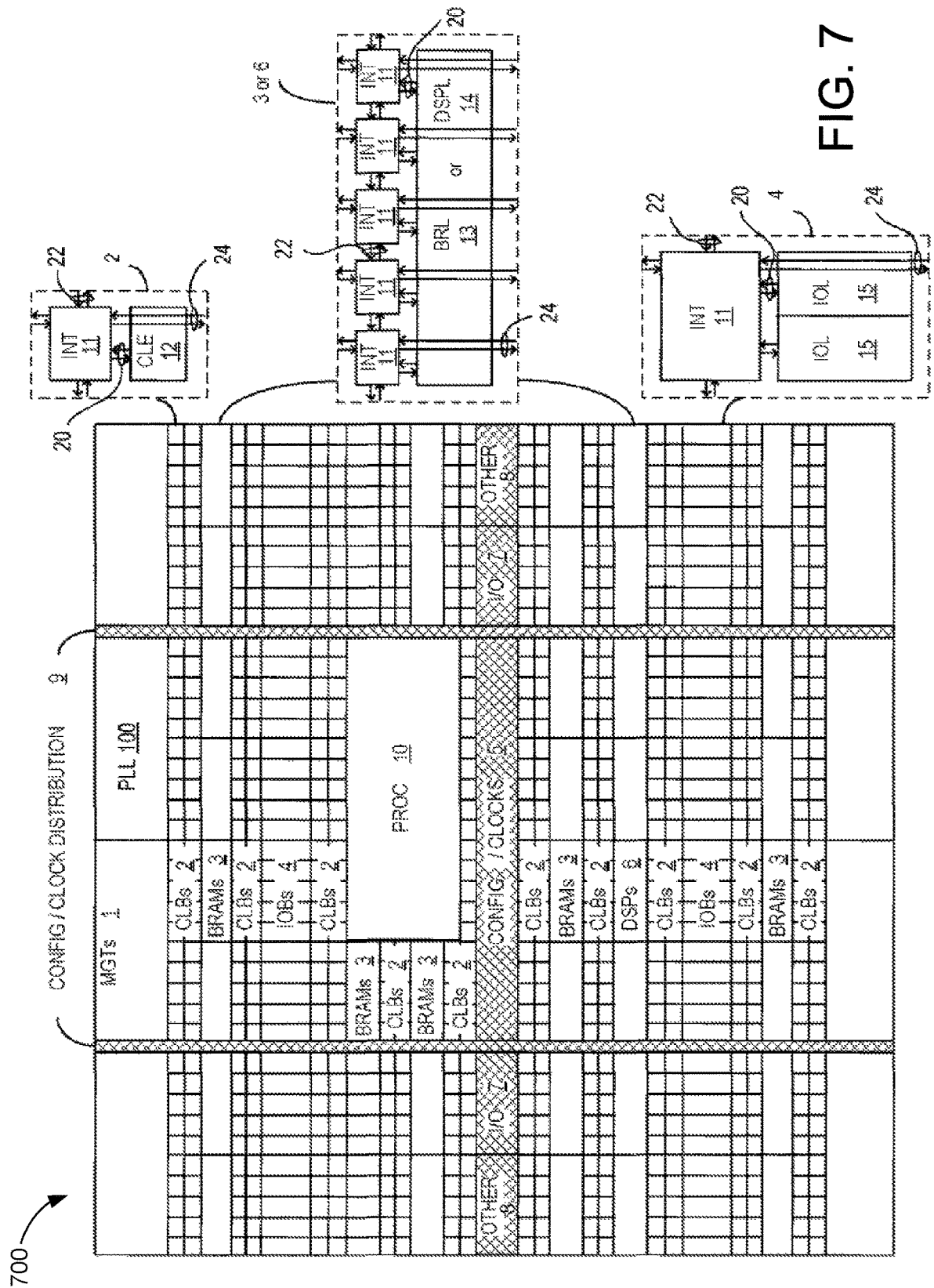
FIG. 7 illustrates an architecture of an example field programmable gate array (FPGA) within which the embodiments disclosed herein may be implemented.

FIG. 7 illustrates an architecture of an FPGA 700 that includes a number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 7. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 7) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A frequency divider comprising:
    a frequency sub-divider including an input to receive an input clock and including an output to provide a frequency divided clock;
    a delay circuit including a plurality of single-edge triggered flip-flops connected in series, and configured to delay the frequency divided clock by N+0.5 cycles of the input clock to generate a delayed clock; and
    a logic gate including a first input to receive the frequency divided clock, including a second input to receive the delayed clock, and configured to perform a logical AND operation or a logical NAND operation on the frequency divided clock and the delayed clock to generate an output clock having a frequency that is equal to 1/(N+0.5) times a frequency of the input clock, wherein N is an integer greater than one.

2. The frequency divider of claim 1, wherein a last of the plurality of single-edge triggered flip-flops is configured to sample data on first edges of the input clock, and the other single-edge triggered flip-flops are configured to sample data on second edges of the input clock.

3. The frequency divider of claim 2, wherein the last single-edge triggered flip-flop of the plurality of single-edge triggered flip-flops is exclusively associated with a critical timing path of the frequency divider.

4. The frequency divider of claim 1, wherein the frequency of the output clock is 1/5.5 times the frequency of the input clock, and the frequency divided clock has a frequency that is 1/11 times the frequency of the input clock.

5. The frequency divider of claim 4 wherein the plurality of single-edge triggered flip-flops is configured to delay the frequency divided clock by 5.5 cycles of the input clock to generate the delayed clock.

6. The frequency divider of claim 4, wherein the frequency divided clock has a duty cycle equal to 8/11.

7. The frequency divider of claim 4, wherein the frequency sub-divider comprises:
   first and second divide-by-4 frequency dividers cascaded together; and
   a synchronization flip-flop including a data input to receive an output signal from the first divide-by-4 frequency divider, including a clock input to receive the input clock, and including an output to generate the frequency divided clock.

8. The frequency divider of claim 7, wherein the frequency sub-divider further comprises:
   a count detector configured to generate a count signal based on output signals generated by the first and second divide-by-4 frequency dividers; and
   a reset flip-flop configured to generate a reset signal based on the count signal.

9. The frequency divider of claim 8, wherein the reset flip-flop is configured to assert the reset signal based on the count signal having a value equal to 10.

10. A frequency divider comprising:
    an input to receive an input clock;
    an output circuit to generate an output clock having a frequency that is equal to 1/5.5 times a frequency of the input clock;
    a frequency sub-divider having an input to receive the input clock and configured to generate a frequency divided clock having a frequency equal to 1/11 times the frequency of the input clock; and
    a delay circuit including six single-edge triggered flip-flops coupled in series between the frequency sub-divider and the output circuit, wherein a first five of the six single-edge triggered flip-flops are clocked on first edges of the input clock, and a sixth single-edge triggered flip-flop is clocked on second edges of the input clock.

11. The frequency divider of claim 10, wherein the delay circuit is configured to delay the frequency divided clock by 5.5 cycles of the input clock to generate a delayed clock.

12. The frequency divider of claim 11, wherein the frequency divided clock has a duty cycle equal to 5/11.

13. The frequency divider of claim 11, wherein the output circuit includes a first input to receive the frequency divided clock, and includes a second input to receive the delayed clock.

14. The frequency divider of claim 13, wherein the output circuit comprises a logic gate configured to perform a logical AND or a logical NAND operation on the frequency divided clock and the delayed clock to generate the output clock.

15. The frequency divider of claim 10, wherein the frequency sub-divider comprises:
    first and second divide-by-4 frequency dividers cascaded together; and
    a synchronization flip-flop including a data input to receive an output signal from the first divide-by-4 frequency divider, including a clock input to receive the input clock, and including an output to generate the frequency divided clock.

16. The frequency divider of claim 15, wherein the frequency sub-divider further comprises:
    a count detector configured to generate a count signal based on output signals generated by the first and second divide-by-4 frequency dividers; and
    a reset flip-flop configured to generate a reset signal based on the count signal.

17. A method for generating an output clock having a frequency that is equal to $1/(N+0.5)$ times a frequency of an input clock, the method comprising:
    frequency-dividing the input clock to generate a frequency divided clock using a number of cascaded divide-by-four frequency dividers;
    delaying the frequency divided clock by N+0.5 cycles of the input clock to generate a delayed clock using a plurality of single-edge triggered flip-flops; and
    logically combining, using a logical AND operation or a logical NAND operation, the frequency divided clock and the delayed clock to generate the output clock, wherein N is an integer greater than one.

18. The method of claim 17, wherein the frequency of the output clock is 1/5.5 times the frequency of the input clock, the frequency divided clock has a frequency that is 1/11 times the frequency of the input clock, and the delayed clock is a version of the frequency divided clock delayed by 5.5 cycles of the input clock.

19. The method of claim 17, wherein a last of the single-edge triggered flip-flops is configured to sample data on first edges of the input clock, and the other single-edge triggered flip-flops are configured to sample data on second edges of the input clock.

* * * * *